United States Patent
Kim

(10) Patent No.: US 10,481,224 B2
(45) Date of Patent: Nov. 19, 2019

(54) RF SURFACE COIL UNIT AND MAGNETIC RESONANCE IMAGING SYSTEM COMPRISING SAME

(71) Applicant: Samsung Electronics Co., Ltd., Suwon-si (KR)

(72) Inventor: Kyoungnam Kim, Incheon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 372 days.

(21) Appl. No.: 15/318,090

(22) PCT Filed: Jun. 10, 2015

(86) PCT No.: PCT/KR2015/005804
§ 371 (c)(1),
(2) Date: Dec. 12, 2016

(87) PCT Pub. No.: WO2015/190818
PCT Pub. Date: Dec. 17, 2015

(65) Prior Publication Data
US 2017/0123023 A1    May 4, 2017

(30) Foreign Application Priority Data
Jun. 12, 2014  (KR) .......................... 10-2014-0071486

(51) Int. Cl.
*A61B 5/055* (2006.01)
*G01R 33/341* (2006.01)

(52) U.S. Cl.
CPC ............ *G01R 33/341* (2013.01); *A61B 5/055* (2013.01)

(58) Field of Classification Search
CPC ............................. A61B 5/055; G01R 33/341
See application file for complete search history.

(56) References Cited

U.S. PATENT DOCUMENTS

| | | | |
|---|---|---|---|
| 5,382,903 A | 1/1995 | Young | |
| 5,483,159 A | 1/1996 | Van Heelsbergen | |
| 6,097,186 A | 8/2000 | Nabetani | |
| 6,198,962 B1 | 3/2001 | Su | |
| 6,831,460 B2 | 12/2004 | Reisker et al. | |
| 7,733,088 B2 | 6/2010 | Cho et al. | |
| 2005/0231201 A1* | 10/2005 | Fujimoto | G01R 33/3415 324/318 |
| 2005/0253582 A1* | 11/2005 | Giaquinto | G01R 33/3415 324/318 |
| 2006/0214661 A1 | 9/2006 | Steen et al. | |
| 2012/0268132 A1 | 10/2012 | Zhu et al. | |

FOREIGN PATENT DOCUMENTS

JP    5-308017 A    11/1993

OTHER PUBLICATIONS

International Search Report dated Sep. 14, 2015 in counterpart International Application No. PCT/KR2015/005804 (2 pages in English).

* cited by examiner

*Primary Examiner* — Ruth S Smith
(74) *Attorney, Agent, or Firm* — NSIP Law

(57) ABSTRACT

A radio frequency (RF) surface coil unit and a magnetic resonance imaging (MRI) system including the same are provided. The RF surface coil unit is a bulk-type RF surface coil, and includes a plurality of RF coil elements formed on a cylindrical-shaped base, wherein at least one pair of the plurality of RF coil elements include facing RF coil elements that are electrically connected to each other and are formed as one channel.

7 Claims, 5 Drawing Sheets

RF SURFACE COIL UNIT AND MAGNETIC RESONANCE IMAGING SYSTEM COMPRISING SAME

CROSS-REFERENCE TO RELATED APPLICATIONS

This application claims the benefit under 35 USC 119(a) of PCT Application No. PCT/KR2015/005804, filed on Jun. 10, 2015, which claims the benefit of Korean Patent Application No. 10-2014-0071486 filed Jun. 12, 2014, in the Korean Intellectual Property Office, the entire disclosure of which is incorporated herein by reference for all purposes.

TECHNICAL FIELD

The present invention relates to a radio frequency (RF) surface coil unit for use in a magnetic resonance imaging (MRI) system and an MRI system including the RF surface coil unit.

BACKGROUND ART

Diverse diagnostic apparatuses for diagnosing an abnormality in a physical body have been used to prevent and cure diseases. Among them, a magnetic resonance imaging (MRI) apparatus that uses a magnetic field generated by a magnetic force is widely used.

The MRI apparatus is an apparatus for acquiring a sectional image of a part of an object by expressing, via a contrast comparison, a strength of a magnetic resonance (MR) signal with respect to a radio frequency (RF) signal generated in a magnetic field having a specific strength. If an RF signal that resonates only a specific atomic nucleus (for example, a hydrogen atomic nucleus) is irradiated for a short period time by using an RF coil onto the object that is placed in a strong magnetic field, and then the irradiation is stopped, an MR signal is emitted from the specific atomic nucleus, and thus the MRI apparatus may receive the MR signal via the RF coil and acquire an MR image. An intensity of the MR signal may be determined according to an amount of a predetermined atom (for example, hydrogen, sodium, or carbon isotopes) in the object or a blood flow.

DETAILED DESCRIPTION OF THE INVENTION

Technical Problem

Embodiments disclosed herein relate to a magnetic resonance imaging (MRI) system including a radio frequency (RF) surface coil which includes facing loop coils that are electrically connected to each other. The technical problems to be solved by the present embodiments are not limited to the above-described one and other technical problems may further be solved.

Technical Solution

According to an embodiment of the present invention, a radio frequency (RF) surface coil unit of a magnetic resonance imaging (MRI) system, the RF surface coil unit comprising:
a plurality of RF coil elements formed on a cylindrical-shaped base,
wherein at least one pair of the plurality of RF coil elements comprise facing RF coil elements that are electrically connected to each other.

The plurality of RF coil elements may have a loop shape.

The at least one pair of the plurality of RF coil elements, the at least one pair comprising the facing RF coil elements that are electrically connected to each other, may be formed as one channel.

The at least one pair of the plurality of RF coil elements may form at least one linear field.

The at least one linear field formed by the at least one pair of the plurality of RF coil elements may overlap with each other at an inner side of the cylindrical-shaped base.

A conductive layer configured to electrically connect the facing RF coil elements from the at least one pair of the plurality of RF coil elements to each other may be formed at an end of the cylindrical-shaped base.

The conductive layer may form a loop coil element on the end of the cylindrical-shaped base.

A size of a loop of the loop coil element may be equal to or less than a size of a loop formed by the plurality of RF coil elements.

The conductive layer may be connected to an RF source.

According to an embodiment of the present invention, a magnetic resonance imaging (MRI) system comprising a radio frequency (RF) surface coil unit comprising:
a plurality of radio frequency (RF) coil elements formed on a cylindrical-shaped base,
wherein at least one pair of the plurality of RF coil elements comprises facing RF coil elements that are electrically connected to each other.

Advantageous Effects of the Invention

According to the embodiments disclosed herein, in a magnetic resonance imaging (MRI) system, facing radio frequency (RF) coil elements may be electrically connected to each other and may form linear fields overlapping with one another, thereby forming a uniform magnetic field in a bulk-type RF surface coil unit. Also, an additional loop element may be formed at an end of the RF surface coil unit to improve the uniformity of magnetic fields in all directions (x, y, and z directions) of an area of the RF surface coil unit where an object is located.

Based on the arrangement of the coil elements of the RF surface coil unit, a phased array coil, which maintains constant a signal to noise ratio (SNR) of a magnetic resonance image while having the effect of using twice the restricted number of RF transmission or reception channels, may be provided.

MODE OF THE INVENTION

Figure 1:
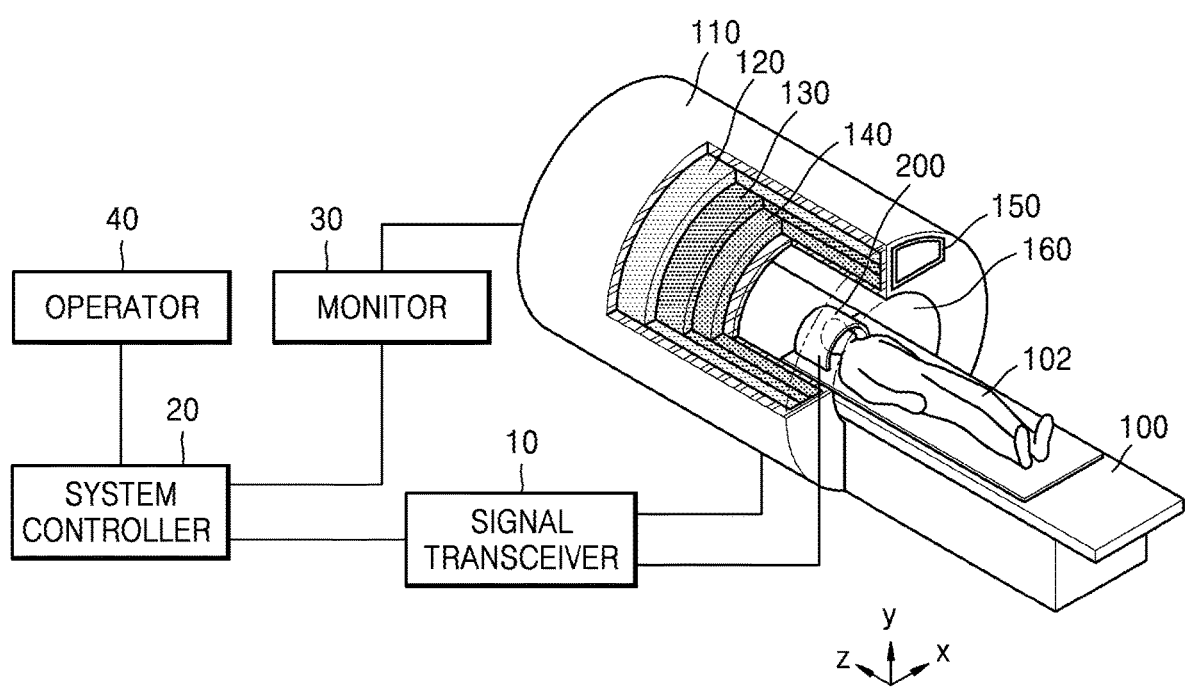
FIG. 1 is a structural diagram of a magnetic resonance imaging (MRI) system according to an embodiment.

Hereinafter, a radio frequency (RF) surface coil unit and a magnetic resonance imaging (MRI) system including the RF surface coil unit according to embodiments of the present invention will be described in detail by referring to the accompanying drawings. In the drawings, the thicknesses of layers and regions may be exaggerated for clarity. Like reference numerals refer to like elements throughout.

FIG. 1 is a structural diagram of an MRI system according to an embodiment. Referring to FIG. 1, the MRI system according to the present embodiment may include a main magnet 120 mounted in a housing 110 of a cylindrical shape, a gradient coil unit 130, and an RF body coil unit 140.

The main magnet 120 may generate a magnetostatic field or a static magnetic field for aligning, in a constant direction, a direction of magnetic dipole moments of atomic nuclei of elements causing magnetic resonance, such as hydrogen, phosphorous, or sodium, from among elements distributed in an object 102. In the present specification, an "object" may include a person or an animal, or a part of a person or an animal. For example, the object 102 may include the liver, the heart, the womb, the brain, the breast, the abdomen, or a blood vessel. The main magnet 120 may include a superconducting magnet or a permanent magnet. For example, the superconducting magnet may generate a high magnetic field that is equal to or higher than 0.5 T. As the magnetic field generated by the main magnet 120 is strong and uniform, a more precise and accurate magnetic resonance image with respect to the object 102 may be obtained. The main magnet 120 may have a cylindrical shape.

The gradient coil unit 130 may be formed at an inner side of the main magnet 120. The gradient coil unit 130 may include three gradient coils for generating gradient magnetic fields in X-, Y-, and Z-axis directions crossing each other at right angles. The gradient coil unit 130 may generate a spatially linear gradient magnetic field for photographing a magnetic resonance image. The gradient coil unit 130 may provide location information of each region of the object 102 by differently inducing resonance frequencies according to the regions of the object 102.

The RF body coil unit 140 may be mounted at an inner side of the gradient coil unit 130, and may be included in the cylindrical-shaped magnetic structure together with the main magnet 120 and the gradient coil unit 130. An RF surface coil unit 200 may be formed adjacent to the object 102 on a table 100. The RF body coil unit 140 and the RF surface coil unit 200 are devices which may generate a high frequency magnetic field having a Lamor frequency as the main frequency. The RF body coil unit 140 and the RF surface coil unit 200 may excite an RF signal onto the object 102 and receive a magnetic resonance signal emitted from the object 102. For example, in order to make an atomic nucleus transit from a low energy state to a high energy state, the RF body coil unit 140 and the RF surface coil unit 200 may generate and apply an electromagnetic wave signal having an RF corresponding to a type of the atomic nucleus, for example, an RF signal, to the object 102. When the electromagnetic wave signal generated by the RF body coil unit 140 and the RF surface coil unit 200 is applied to the atomic nucleus, the atomic nucleus may transit from the low energy state to the high energy state. Then, when electromagnetic waves generated by the RF body coil unit 140 and the RF surface coil unit 200 disappear, the atomic nucleus on which the electromagnetic waves were applied transits from the high energy state to the low energy state, thereby emitting electromagnetic waves having a Lamor frequency. In other words, when the applying of the electromagnetic wave signal to the atomic nucleus is stopped, an energy level of the atomic nucleus is changed from a high energy level to a low energy level, and thus the atomic nucleus may emit electromagnetic waves having a Lamor frequency. The RF body coil unit 140 and the RF surface coil unit 200 may receive electromagnetic wave signals from atomic nuclei in the object 102. The RF body coil unit 140 may be fixed at the inner side of the gradient coil unit 130 of the housing 110, and the RF surface coil unit 200 may be detachable. The RF surface coil unit 200 may be mounted on the table 100 or detached from the table 100 to diagnose a specific region of the object 102. The RF surface coil unit 200 may be a bulk-type RF surface coil configured to diagnose a region of the object 102, wherein the region includes the head, the neck, the shoulder, the wrist, the leg, the ankle, etc. of the object 102.

The housing 110 including the main magnet 120, the gradient coil unit 130, and the RF body coil unit 140 may have a cylindrical shape. A bore 160, which is a space into which the table 100 on which the object 102 is located may enter, may be formed in the housing 110. The bore 160 may be formed in the Z-axis direction, and a diameter of the bore 160 may be determined according to sizes of the main magnet 120, the gradient coil unit 130, and the RF body coil unit 140.

A display 150 may be mounted at an outer side of the housing 110 of the MRI system. Also, a display may further be included at an inner side of the housing 110. Certain information may be transmitted to a user or the object 102 through the display(s) located at the inner side and/or the outer side of the housing 110.

Also, the MRI system may include a signal transceiver 10, a system controller 20, a monitor 30, and an operator 40.

The signal transceiver 10 may control a gradient magnetic field formed in the housing 110, that is, the bore 160, and may control transmission and reception of an RF signal and a magnetic resonance signal related to the RF body coil unit 140 and the RF surface coil unit 200. The system controller 20 may control a sequence of signals generated in the housing 110. The monitor 30 may monitor or control the housing 110 or various devices mounted in the housing 110. The operator 40 may order pulse sequence information from the system controller 20, and control overall operations of the MRI system. The object 102, located on the table 100, may be inspected in a state in which the object 102 is moved and fixed in a direction in which the bore 102 is formed, that is, the Z-axis direction, or in a state in which the object 102 is being moved.

Figure 2:
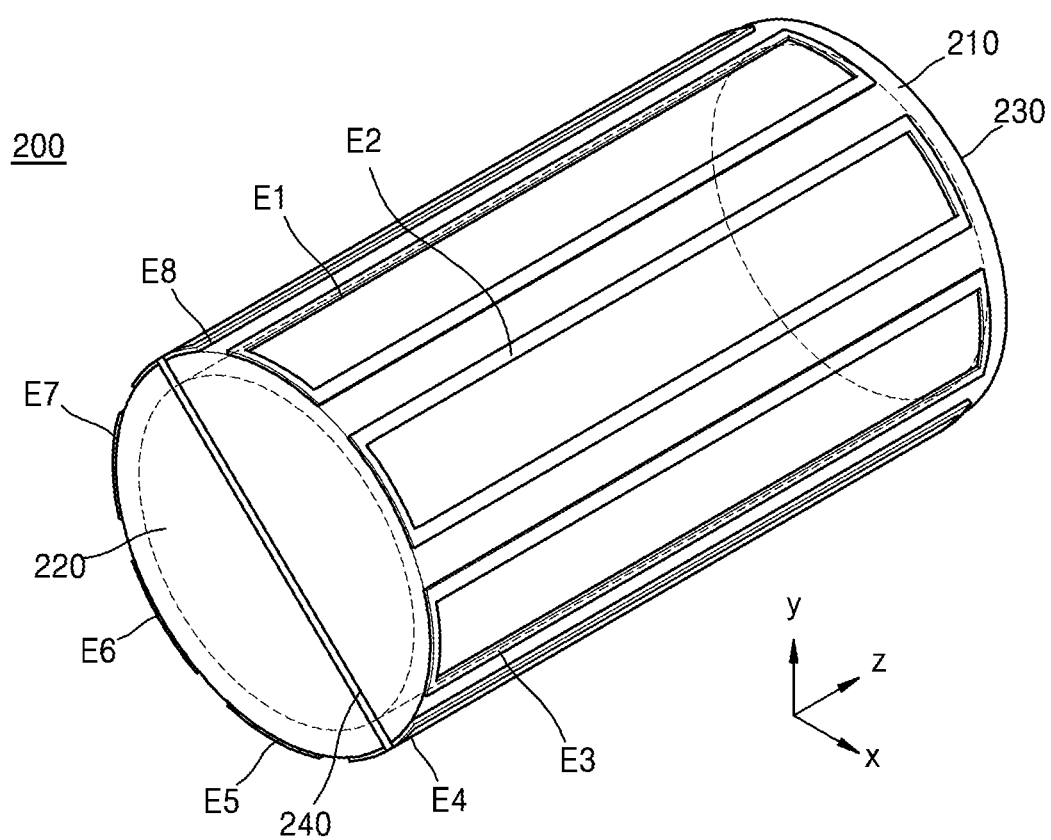
FIG. 2 is a view of an example of a radio frequency (RF) surface coil unit of an MRI system, according to an embodiment.
Figure 3:
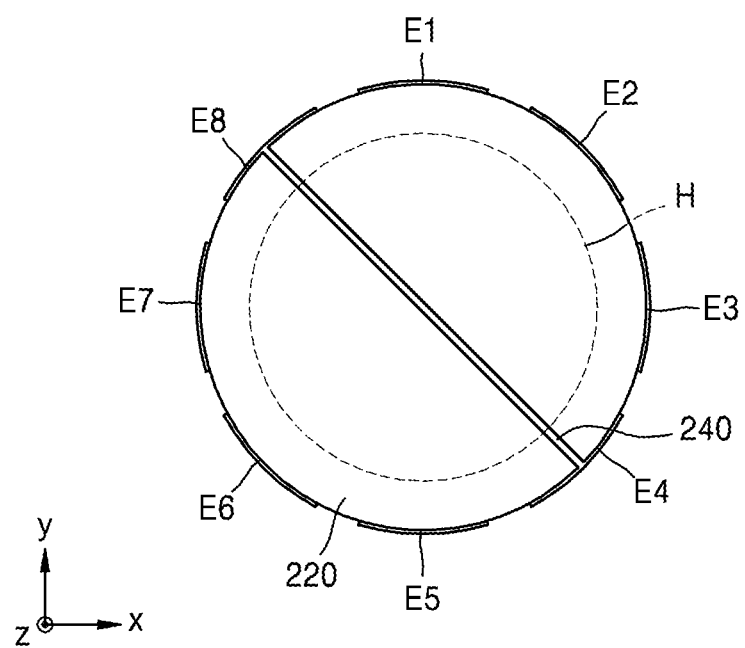
FIG. 3 is a view of an end of the RF surface coil unit of FIG. 2.

FIG. 2 is a view of an example of the RF surface coil unit 200 of the MRI system, according to an embodiment. FIG. 3 is a view of a first end 220 of the RF surface coil 200 unit of FIG. 2.

Referring to FIGS. 2 and 3, the RF surface coil unit 200 may include a plurality of RF coil elements E1 through E8 formed on a base 210. The RF coil elements E1 through E8 may be formed on a surface of the base 210 to have a loop shape, and at least one pair of the RF coil elements E1 through E8 which face each other from among the RF coil elements E1 through E8 may be electrically connected to each other. Here, the RF coil elements E1 through E8 that face each other from among the RF coil elements E1 through E8 may be RF coil elements located on the same line when a virtual straight line is drawn based on a center of the RF coil unit 200. For example, based on the center of the RF surface coil unit 200 of FIG. 3, the RF coil elements E1 and E5 may face each other and may be electrically connected to each other to form a linear field. Also, the RF coil elements E2 and E6, E3 and E7, and E4 and E8, respectively, may face each other and may be electrically connected to each other to form a linear field. The linear fields generated by the RF coil elements E1 through E8 that face each other may be overlapped. The RF coil elements E1 and E5, E2 and E6, E3 and E7, and E4 and E8, which respectively face each other, from among the RF coil elements E1 through E8, may be electrically connected to each other, respectively, thereby forming a channel. FIG. 2 illustrates an example in which the RF surface coil unit 200 includes the eight RF coil elements E1 through E8 and the RF coil elements E1 through E8 that face each other are electrically connected to each other, thereby forming the total four channels. However, the RF surface coil unit 200 is not limited thereto. The number of RF coil elements formed on the base 210 of the RF surface coil unit 200 may vary from 4 to 128. Since the RF coil elements E1 through E8 that face each other are electrically cross-connected and form the linear fields, which are overlapped with one another, the uniformity of a magnetic field in x and y surface directions of the RF surface coil unit 200 may be improved.

The base 210 of the RF surface coil unit 200 may be formed to have a cylindrical shape and may include a first end 220 and a second end 230. Electrode lines for electrically connecting the coil elements E1 and E5, E2 and E6, E3 and E7, and E4 and E8, respectively, which respectively face each other, may be formed in the first end 220, and the electrode lines may receive power from the outside, for example, via a coaxial cable. The second end 230 of the RF surface coil unit 200 may be open so that the object 102 may be mounted and located on the table 100. The RF surface coil unit 200 may have an empty space inside thereof, since the second end 230 is open, and at least a physical part of the object 102, for example, an upper body part including the head or a lower body part including the leg, may be entered into the empty space of the RF surface coil unit 200. That is, an area H of the RF surface coil unit 200 of FIG. 3 is an area where at least a physical part of the object 102 may be located, and where the RF coil elements E1 and E5, E2 and E6, E3 and E7, and E4 and E8 that face each other may be electrically connected to each other, respectively, to form the linear fields, thereby forming a uniform magnetic field in the x and y surface directions.

The base 210 may include a non-magnetic material which is rigid and light and has excellent corrosion resistance and moldability. The base 210 may include an insulating polymer and a plastic material. For example, the base 210 may include fiber reinforced plastics (FRP), and in particular, glass fiber reinforced plastics (GFRP). The RF coil elements E1 and E5, E2 and E6, E3 and E7, and E4 and E8 may include a conductive material. For example, a metal having high electrical conductivity, such as copper, stainless steel, etc., may be patterned in the RF coil elements E1 and E5, E2 and E6, E3 and E7, and E4 and E8. However, the RF coil elements E1 and E5, E2 and E6, E3 and E7, and E4 and E8 are not limited thereto.

Figure 4:
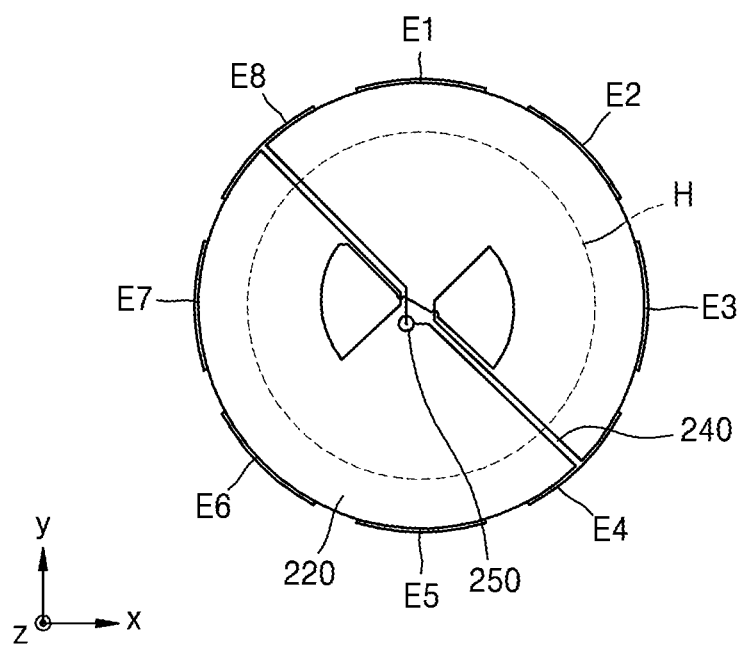
FIG. 4 is a view of an RF surface coil unit of an MRI system, wherein an additional loop coil is formed at an end of the RF surface coil unit.

FIG. 4 is a view of the RF surface coil unit 200 of the MRI system, wherein an additional loop coil is formed at the first end 220 of the RF surface coil unit 200.

Referring to FIG. 4, a conductive layer 240 including a conducive material for electrically connecting at least one pair of RF coil elements that face each other from among the RF coil elements E1 and E5, E2 and E6, E3 and E7, and E4 and E8 may be form at the first end 220 of the RF surface coil unit 200 of the MRI system. The conductive layer 240 may be formed at the first end 220 of the RF surface coil unit 200 to have a loop shape. The conductive layer 240 may receive power from the outside and supply the power to the RF coil elements E1 and E5, E2 and E6, E3 and E7, and E4 and E8. The conductive layer 240 may have the loop shape itself, and thus, the conductive layer 240 may apply a uniform magnetic field to the object 102 located in the RF surface coil unit 200. That is, the conductive layer 240 may be an additional loop coil element of the RF surface coil unit 200. Since the additional loop coil element may be formed at the first end 220 of the cylindrical-shaped RF surface coil unit 200, the uniformity of the magnetic field in z and x surface directions or z and y surface directions may be improved. A size of the loop of the loop coil elements formed at the first end 220 of the RF surface coil unit 200 by the conductive layer 240 may be the same as or less than a size of the loop of the RF coil elements E1 and E5, E2 and E6, E3 and E7, and E4 and E8. Here, the size of the loop may denote a diameter of the loop when the loop is circular, and may denote an area or a circumferential length of the loop when the loop is not circular. The size and location of the additional loop coil elements at the first end 220 of the RF surface coil unit 200 may be determined according to a location of a region of interest of a magnetic resonance image that is to be obtained, and according to an extent in which an RF field formed in a direction of a main magnetic field is to be spatially shifted.

FIG. 4 illustrates that the conductive layer 240 for connecting the RF coil elements E4 and E8 has the loop shape. However, it is not limited thereto. For example, an additional loop coil may be formed at the first end 220 of the RF surface coil unit 200, by the conductive layer 240 for connecting the RF coil elements E1 and E5, E2 and E6, and E3 and E7.

Figure 5:
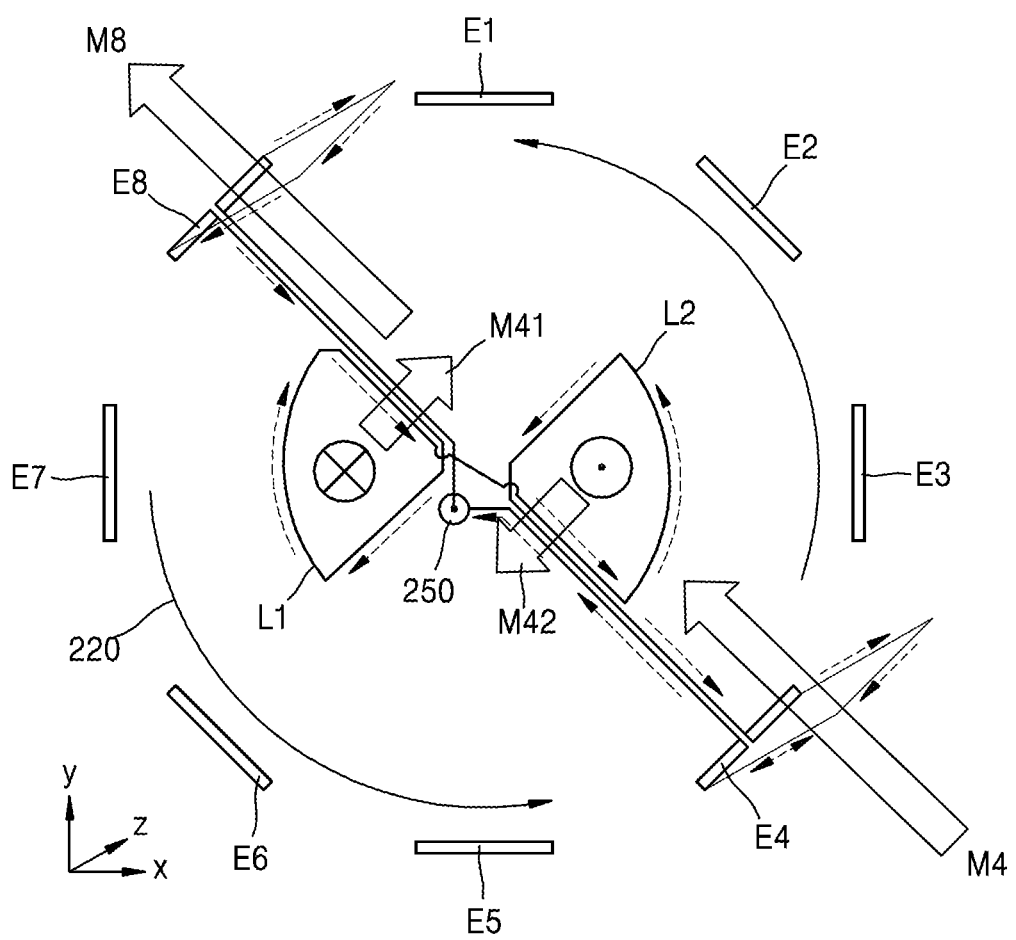
FIG. 5 is a view of a shape of a magnetic field generated when the additional loop coil is formed at the end of the RF surface coil unit as shown in FIG. 4.

FIG. 5 is a view of a shape in which a magnetic field is generated, when the additional loop coil is formed at the end 220 of the RF surface coil unit 200 as shown in FIG. 4.

Referring to FIGS. 4 and 5, the RF coil elements E4 and E8 of the RF surface coil unit 200 may be electrically connected to each other by the conductive layer 240, and the conductive layer 240 may be formed at the first end 220 of the RF surface coil unit 200 to have a loop shape and may be connected to an RF source 250, for example, a coaxial cable. Power may be supplied to the RF coil elements E4 and E8 from the RF source 250 via the conductive layer 240. In FIG. 5, the RF coil element E8, loop coil elements L1 and L2 formed by the conductive layer 240, and the RF coil element E4 are sequentially illustrated according to an order in which power is supplied thereto. However, it is not limited thereto. When power is supplied to the RF coil elements E4 and E8, and the loop coil elements L1 and L2 formed by the conductive layer 240, from the RF source 250, each magnetic field may be generated, and linear magnetic fields M4 and M8 generated in the RF coil elements E4 and E8 may be formed on x and y surfaces, and magnetic fields M41 and M42 based on the loop coil elements L1 and L2 formed by the conductive layer 240 may be formed on z and x surfaces or z and y surfaces.

As described above, in the MRI system according to the embodiments, the RF surface coil unit 200 may include the facing RF coil elements that are electrically connected to each other to form the linear fields. Also, the additional loop coil may be formed at the first end 220 of the RF coil unit 200 to improve the uniformity of the magnetic fields in all directions (x, y, z directions) of an area of the RF surface coil unit 200 where the object 102 is located. Based on the arrangement of the coil elements of the RF surface coil unit 200, a signal to noise ratio (SNR) of a magnetic resonance image may be maintained while the number of channels of the MRI system may be reduced to a half. That is, the effect of using the number of channels that is twice the restricted number of RF transmission or reception channels may be acquired.

The RF surface coil unit 200 may be mounted in an area of the table 100 as illustrated in FIG. 1. The object 102 may be mounted on the table 100 and located in the second end 230 of the RF surface coil unit 200. In some cases, a lower body part of the object 102 may be located inside the RF surface coil unit 200.

It should be understood that the embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

The invention claimed is:

1. A magnetic resonance imaging (MRI) system, the system comprising:
   a plurality of radio frequency (RF) coils arranged on a cylindrical base, where at least one pair of the plurality of RF coils are respective facing RF coils; and
   a conductive layer configured to respectively electrically connect the respective facing RF coils to each other across a first end of the base opposing a second open end of the base,
   wherein the conductive layer forms a loop coil on the first end of the cylindrical base and is configured to apply a uniform magnetic field to an object penetrating the second end.

2. The system of claim 1, wherein the plurality of RF coils each have a loop shape.

3. The system of claim 1, wherein the respective facing RF coils each together respectively form corresponding channels.

4. The system of claim 3, wherein the respective facing RF coils are each together respectively configured to form corresponding linear fields.

5. The system of claim 4, wherein the corresponding linear fields overlap within an inner side of the cylindrical base.

6. The system of claim 1, wherein a size of a loop of the loop coil is equal to or less than a size of a loop formed by one of the respective facing RF coils.

7. The system of claim 1, wherein the conductive layer is connected to an RF source.

* * * * *